United States Patent
Chandrasekaran

(10) Patent No.: US 8,660,207 B2
(45) Date of Patent: Feb. 25, 2014

(54) DIGITAL PRE-DISTORTION WITH CARRIER CANCELLATION

(75) Inventor: Rajiv Chandrasekaran, Bridgewater, NJ (US)

(73) Assignee: Andrew LLC, Hickory, NC (US)

( * ) Notice: Subject to any disclaimer, the term of this patent is extended or adjusted under 35 U.S.C. 154(b) by 0 days.

(21) Appl. No.: 13/431,398

(22) Filed: Mar. 27, 2012

(65) Prior Publication Data

US 2012/0288028 A1 Nov. 15, 2012

Related U.S. Application Data

(60) Provisional application No. 61/485,161, filed on May 12, 2011.

(51) Int. Cl.
*H04K 1/02* (2006.01)

(52) U.S. Cl.
USPC ........... 375/296; 327/133; 341/140; 398/193; 455/114.3

(58) Field of Classification Search
None
See application file for complete search history.

(56) References Cited

U.S. PATENT DOCUMENTS

| | | | |
|---|---|---|---|
| 6,570,444 B2 | 5/2003 | Wright | |
| 6,697,436 B1 | 2/2004 | Wright et al. | |
| 6,798,843 B1 | 9/2004 | Wright et al. | |
| 7,197,085 B1 | 3/2007 | Vella-Coleiro | |
| 7,251,293 B2 | 7/2007 | Vella-Coleiro | |
| 7,561,629 B2 | 7/2009 | Miyatani et al. | |
| 7,583,754 B2 | 9/2009 | Liu | |
| 7,606,324 B2 | 10/2009 | Cai et al. | |
| 7,729,445 B2 | 6/2010 | Ravi et al. | |
| 7,747,224 B2 | 6/2010 | McCallister et al. | |
| 7,751,786 B2 | 7/2010 | McCallister et al. | |
| 7,804,359 B1 * | 9/2010 | Cova | 330/149 |
| 7,804,915 B2 | 9/2010 | Huang et al. | |
| 7,848,451 B2 | 12/2010 | Cai et al. | |
| 7,869,767 B2 | 1/2011 | McCallister et al. | |

OTHER PUBLICATIONS

Notification of Transmittal of The International Search Report and The Written Opinion; Mailed: Jul. 26, 2012 for the corresponding PCT Application No. PCT/US2012/035947.

* cited by examiner

*Primary Examiner* — Adolf Dsouza
(74) *Attorney, Agent, or Firm* — Mendelsohn, Drucker, & Dunleavy, P.C.; Steve Mendelsohn

(57) ABSTRACT

A non-linear power amplifier generates an amplified output signal based on a pre-distorted signal generated by a digital pre-distorter (DPD) based on an input signal. A feedback path generates a feedback signal based on the amplified output signal. The feedback signal is aligned with the input signal, or vice versa, and the aligned signals are used to adaptively update the DPD processing. In particular, a linear FIR filter is estimated to minimize a cost function based on the input and feedback signals. Depending on how the filter is generated, the filter is applied to the input signal or to the feedback signal to generate the aligned input and feedback signals.

38 Claims, 2 Drawing Sheets

DIGITAL PRE-DISTORTION WITH CARRIER CANCELLATION

CROSS-REFERENCE TO RELATED APPLICATIONS

This application claims the benefit of the filing date of U.S. provisional application No. 61/485,161, filed on May 12, 2011, the teachings of which are incorporated herein by reference in their entirety.

BACKGROUND

1. Field of the Invention

The present invention relates to signal processing and, more specifically but not exclusively, to linearizing non-linear systems, such as non-linear amplifiers, using digital pre-distortion.

2. Description of the Related Art

Introduction

This section introduces aspects that may help facilitate a better understanding of the invention. Accordingly, the statements of this section are to be read in this light and are not to be understood as admissions about what is prior art or what is not prior art.

FIG. 1 shows a schematic block diagram of signal-processing system 100, which implements a conventional linearization scheme that employs digital pre-distortion to linearize an analog sub-system 130 having a non-linear amplifier 134. Signal-processing system 100 receives a digital input signal $x[n]$ and generates a linearized, amplified, analog output signal $y_{amp}(t)$.

In particular, the digital (e.g., baseband or IF (intermediate frequency)) input signal $x[n]$ is processed by digital pre-distortion (DPD) module 114 to yield a pre-distorted digital signal $x_{pd}[n]$, which is converted into an analog pre-distorted signal $x_{pd}(t)$ using a digital-to-analog converter (DAC) 120. The output of the DAC is frequency converted to a desired frequency (e.g., RF (radio frequency)) using upconverter 132 to yield an RF analog pre-distorted signal $x_{pd\_rf}(t) = \mathrm{Re}\{x_{pd}(t)e^{jw_c t}\}$. The RF signal $x_{pd\_rf}(t)$ is amplified by non-linear amplifier 134 to yield the output signal $y_{amp}(t)$.

Purpose of Digital Pre-Distortion

The purpose of the digital pre-distortion in signal-processing system 100 is to ensure that the output signal $y_{amp}(t)$ is close to a linear scaled version of the (theoretical) analog version $x(t)$ of the digital input signal $x[n]$. That is, $y_{amp}(t) \cong G x(t)$, where G is a constant. Note that, in the above notation, the digital signal $x[n]$ is a sampled version of the analog signal $x(t)$.

Computation of the Digital Pre-Distortion Function

In a typical implementation, a small portion of the amplifier output signal $y_{amp}(t)$ is removed at tap 140 and mixed down to a suitable intermediate frequency (IF) (or, alternatively, to baseband) using a downconverter 150. The resulting downconverted feedback signal $y_{fb}(t)$ is digitized using an analog-to-digital (ADC) converter 160 to yield digital feedback signal $y_{fb}[n]$.

The digital pre-distortion function implemented by module 114 is initially computed and subsequently adaptively updated by comparing the input signal $x[n]$ with the feedback signal $y_{fb}[n]$ using a controller (not shown in FIG. 1) that may be implemented as part of or separate from DPD module 114. The computation can be performed in one of (at least) the following two ways:

1) In a non-real-time implementation, a block of samples of the input signal $x[n]$ and a block of samples of the feedback signal $y_{fb}[n]$ are captured and processed by the controller offline to estimate the pre-distortion function. Such estimation is typically performed in a DSP (digital signal processor) or microcontroller.

2) In a real-time implementation, the pre-distortion function is updated by the controller on a sample-by-sample basis using an adaptive non-linear filter structure.

Pre-Processing

In both cases, one or both of the signals $x[n]$ and $y_{fb}[n]$ are pre-processed before the controller estimates the pre-distortion function. The pre-processing aligns the delays, gains, and phases of the two signals. Mathematically, this can be described as follows:

Estimate the delay $\tau$ and the complex gain $\alpha$ that minimizes the cost function $C(\tau, \alpha)$, according to Equation (1) as follows:

$$C(\tau,\alpha) = E\{(x[n-\tau] - \alpha y_{fb}[n])^2\}, \tag{1}$$

where $E\{\bullet\}$ denotes the expectation value operator (or average). In the non-real-time implementation, minimizing the cost function reduces to estimating values for the delay $\tau$ and the complex gain $\alpha$ that minimize the cost function in the least-squares sense. Note that the delay $\tau$ and the complex gain $\alpha$ can be estimated successively and/or jointly. Also, note that the delay $\tau$ can be a fractional delay. Techniques for least-squares estimation are well-known. See, for example, W. H. Press, B. P. Flannery, S. A. Teukolsky, and W. T. Vetterling, *Numerical Recipes: The Art of Scientific Computing* (New York: Cambridge University Press, 1986), the teachings of which are incorporated herein by reference. The optimum values of $\tau$ and $\alpha$ are denoted by $\tau_0$ and $\alpha_0$, respectively.

Digital Pre-Distortion Function

After the pre-processing, the digital pre-distortion can be described as estimating the arbitrary non-linear function $f_{pd}(\cdot)$ that minimizes the deviation D, according to Equation (2) as follows:

$$D = E\{(f_{pd}(x[n-\tau_0], x[n-\tau_0-1], x[n-\tau_0+1], \ldots) - \alpha_0 y_{fb}[n])^2\} \tag{2}$$

Limitations of Prior Art

The pre-processing of the input signals as represented in Equation (1) assumes a delay (denoted by the estimation of parameter $\tau$) and a phase alignment (denoted by the estimation of parameter $\alpha$). If there are other linear distortion products that result in further misalignment between the input signal $x[n]$ and the feedback signal $y_{fb}[n]$, then the above alignment procedure may limit the linearity and stability of the digital pre-distortion algorithm.

SUMMARY

In one embodiment, the present invention is a linearized system comprising an adaptive pre-distorter configured to pre-distort an input signal to generate a pre-distorted signal, a non-linear transmit path configured to generate an output signal from the pre-distorted signal, and a feedback path configured to generate a feedback signal based on the output signal. The system is configured to adapt the adaptive pre-distorter by (1) optimizing a filter that minimizes a cost function based on the input signal and the feedback signal, (2) applying the optimized filter to the input signal or the feedback signal to generate an aligned input signal and an aligned feedback signal, and (3) updating the adaptive pre-distorter based on the aligned input and feedback signals.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
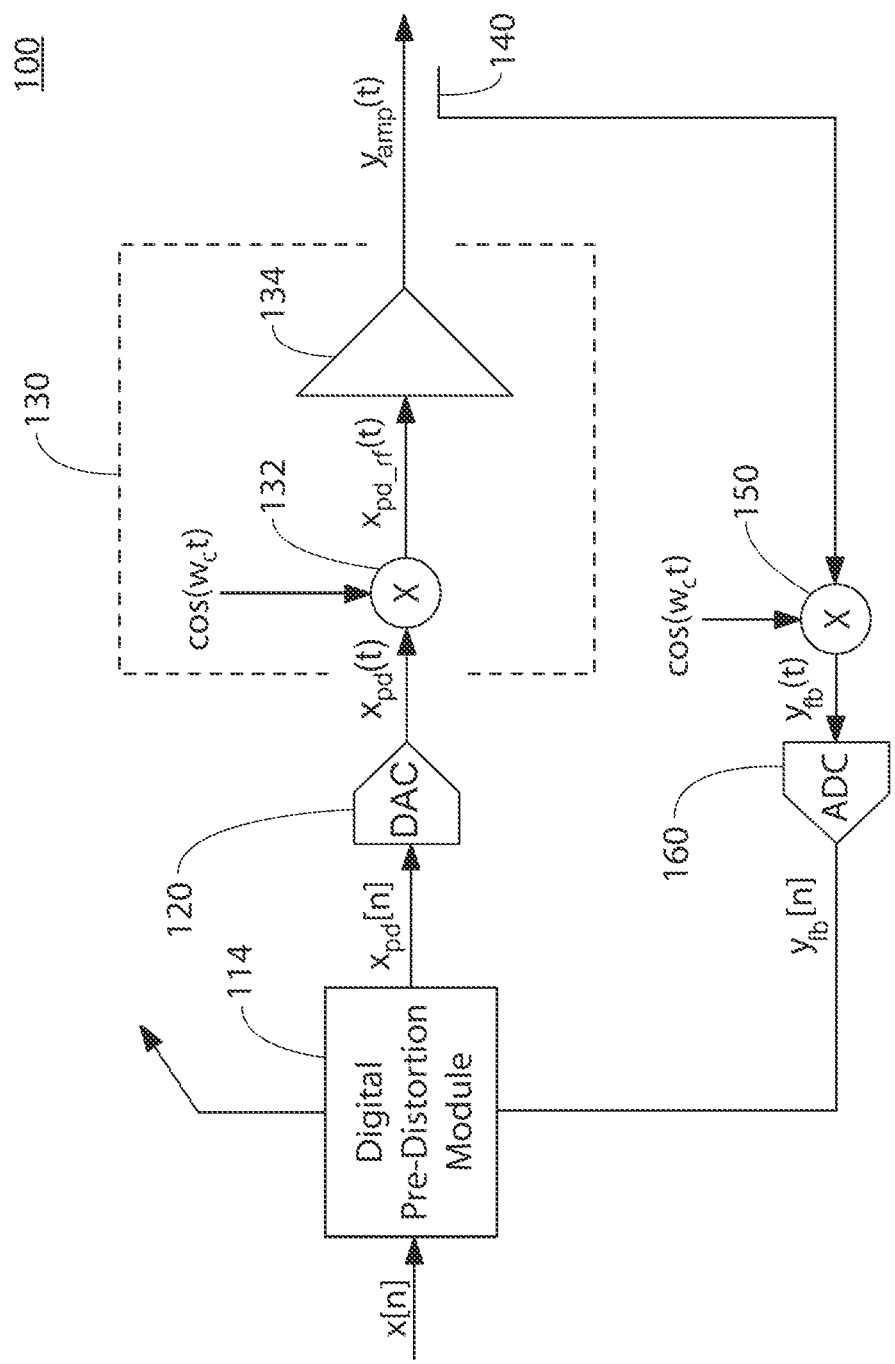
FIG. 1 shows a schematic block diagram of a signal-processing system that implements a conventional linearization scheme that employs digital pre-distortion to linearize a non-linear sub-system having a non-linear amplifier.
Figure 2:
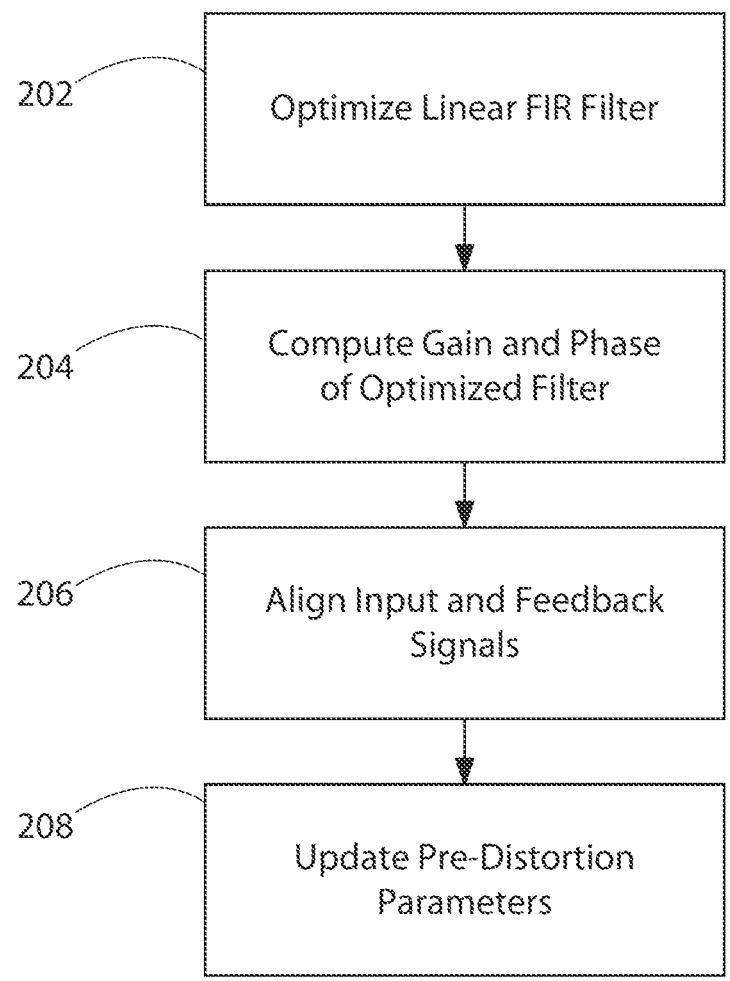
FIG. 2 shows a flow diagram of alignment processing according to one embodiment of the disclosure.

FIG. 2 shows a flow diagram of alignment processing according to one embodiment of the disclosure. The processing of FIG. 2 is intended to align the input signal x[n] and the feedback signal $y_{fb}[n]$ prior to those signals being used to update the pre-distortion parameters used to pre-distort input signal x[n] in adaptive DPD module 114 of FIG. 1. In a typical implementation, the processing of FIG. 2 is implemented by the same digital processor that implements DPD module 114.

In step 202 of FIG. 2, for a corresponding set of samples of both the input signal x[n] and the feedback signal $y_{fb}[n]$, a linear finite impulse response (FIR) filter $h_a[n]$ of length $N_h$ is estimated that minimizes a cost function C(h), according to Equation (3) as follows:

$$C(h)=E\{(x[n]*h_a[n]-y_{fb}[n])^2\}. \quad (3)$$

where * denotes convolution. Conventional methods, such as least-squares (LS), total-least-squares (TLS), recursive least squares (RLS), Gradient Descent, or least mean-squares (LMS), may be applied to minimize the cost function in Equation (3) to obtain an optimal solution. The optimized filter resulting from the above optimization is denoted by $h_{a\_opt}[n]$.

In step 204, the complex gain (magnitude and phase) $g_{a\_opt}$ of the optimized filter $h_{a\_opt}[n]$ are computed at zero frequency, according to Equation (4) as follows:

$$g_{a\_opt} = \sum_{k=0}^{N_h-1} h_{a\_opt}[k] \quad (4)$$

In step 206, the input and feedback signals are aligned, according to Equations (5) and (6) as follows:

$$x_p[n] = x[n] * \frac{h_{a\_opt}[n]}{g_{a\_opt}} \quad (5)$$

$$y_{fb\_p}[n] = y_{fb}[n] \quad (6)$$

Dividing the optimized filter $h_{a\_opt}[n]$ by the complex gain $g_{a\_opt}$ normalizes the filter such that the average magnitude and the average phase of the filtered input signal $x_p[n]$ are equal to the average magnitude and the average phase of the original input signal x[n]. The resulting aligned input and feedback signals $x_p[n]$ and $y_{fb\_p}[n]$ can now be used in step 208 to estimate and update the pre-distortion parameters using conventional processing techniques.

Note that, in the special case where $h_{a\_opt}[n]$ represents a filter that performs time and complex gain alignment only, the solution reduces to that of the alignment in Equation (1). However, in the general case, the above alignment algorithm provides a better alignment of the input and feedback signals for pre-distortion because of the additional degrees of freedom accorded by the FIR filter $h_{a\_opt}[n]$.

In a non-real-time implementation, a block of samples of input signal x[n] and a block of samples of feedback signal $y_{fb}[n]$ are captured and processed offline to estimate the filter $h_{a\_opt}[n]$ using a technique such as LS or TLS. In a real-time implementation, the filter $h_{a\_opt}[n]$ can be obtained on a sample-by-sample basis using an adaptive filtering method such as RLS or LMS.

In both non-real-time and real-time implementations, the estimation of the filter coefficients $h_{a\_opt}[n]$ and the application of the filter according to Equations (5) and (6) can be performed after prior-art gain and time alignment of x[n] and $y_{fb}[n]$ according to Equation (1) has been performed, for enhanced accuracy.

The alignment processing of Equations (3)-(6) modifies the input signal x[n] so as to align it with the feedback signal $y_{fb}[n]$ by applying the normalized filter to the input signal. In an alternative embodiment, the feedback signal $y_{fb}[n]$ can be modified to be aligned with the input signal x[n] by applying an appropriate, different normalized filter to the feedback signal. This alternative embodiment can be presented by Equations (7)-(10) as follows:

$$C(h) = E\{(y_{fb}[n]*h_b[n]-x[n])^2\}. \quad (7)$$

$$g_{b\_opt} = \sum_{k=0}^{N_h-1} h_{b\_opt}[k] \quad (8)$$

$$y_{fb\_p}[n] = y_{fb}[n] * \frac{h_{b\_opt}[n]}{g_{b\_opt}} \quad (9)$$

$$x_p[n] = x[n] \quad (10)$$

where the cost function C(h) is minimized to optimize the alternative filter $h_b[n]$, and $g_{b\_opt}$ is the complex gain of that alternative filter. Although probably not a practical solution, it is also technically possible to generate two different filters, one for the input signal and one for the feedback signal, such that both the input and feedback signals are appropriately filtered to align them to each other.

Although the present invention has been described in the context of linearizing an analog sub-system having a non-linear amplifier, the invention can also be implemented in other contexts. For example, the invention can be implemented to linearize an analog sub-system having one or more of the following elements: baseband amplification, IF (intermediate frequency) amplification, RF amplification, frequency upconversion, frequency downconversion, vector modulation. Furthermore, depending on the frequency requirements of the particular application and the frequency capabilities of the physical components used to implement the various elements, upconverter 132 and/or downconverter 150 of FIG. 1 may be omitted. Note that, in certain implementations, upconversion and/or downconversion may be partially or even completely implemented in the digital domain.

The present invention may be implemented as (analog, digital, or a hybrid of both analog and digital) circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, microcontroller, general-purpose computer, or other processor.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the invention. The present invention can also be embodied in the form of program code, for example, stored in a non-transitory machine-readable storage medium including being loaded into and/or executed by a machine, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It should be appreciated by those of ordinary skill in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. A linearized system comprising:
an adaptive pre-distorter configured to pre-distort an input signal to generate a pre-distorted signal;
a non-linear transmit path configured to generate an output signal from the pre-distorted signal; and
a feedback path configured to generate a feedback signal based on the output signal, wherein the feedback signal has multiple different types of linear distortions including a first linear distortion that is not a linear time distortion, and the system is configured to adapt the adaptive pre-distorter by:
(1) optimizing complex filter coefficients of a linear finite impulse response (FIR) filter to minimize a cost function based on the filter, the input signal, and the feedback signal;
(2) applying the optimized linear FIR filter to the input signal or the feedback signal to generate an aligned input signal and an aligned feedback signal, wherein the optimized linear FIR filter aligns the input and feedback signals with respect to all of the multiple different types of linear distortions in the feedback signal including the first linear distortion; and
(3) updating the adaptive pre-distorter based on the aligned input and feedback signals.

2. The invention of claim 1, wherein the non-linear transmit path comprises a non-linear power amplifier.

3. The invention of claim 1, wherein the cost function C(h) is given by:

$$C(h)=E\{(x[n]*h_a[n]-y_{fb}[n])^2\}$$

where:
x[n] is the input signal;
$y_{fb}[n]$ is the feedback signal;
$h_a[n]$ is the filter;
* denotes convolution; and
E{.} is an expectation operator.

4. The invention of claim 3, wherein the system is configured to compute the complex gain $g_{a\_opt}$ of the optimized filter $h_{a\_opt}[n]$ at zero frequency according to:

$$g_{a\_opt} = \sum_{k=0}^{N_h-1} h_{a\_opt}[k]$$

where:
$N_h$ is the length of the optimized filter.

5. The invention of claim 4, wherein:
the system is configured to generate the aligned input signal $x_p[n]$ according to:

$$x_p[n] = x[n] * \frac{h_{a\_opt}[n]}{g_{a\_opt}}$$

and the system is configured to generate the aligned feedback signal $y_{fb\_p}[n]$ according to:

$$y_{fb\_p}[n]=y_{fb}[n].$$

6. The invention of claim 1, wherein the cost function C(h) is given by:

$$C(h)=E\{(y_{fb}[n]*h_b[n]-x[n])^2\}$$

where:
x[n] is the input signal;
$y_{fb}[n]$ is the feedback signal;
$h_b[n]$ is the filter;
* denotes convolution; and
E{.} is an expectation operator.

7. The invention of claim 6, wherein the system is configured to compute the complex gain $g_{b\_opt}$ of the optimized filter $h_{b\_opt}[n]$ at zero frequency according to:

$$g_{b\_opt} = \sum_{k=0}^{N_h-1} h_{b\_opt}[k]$$

where:
$N_h$ is the length of the optimized filter.

8. The invention of claim 7, wherein:
the system is configured to generate the aligned feedback signal $y_{fb\_p}[n]$ according to:

$$y_{fb\_p}[n] = y_{fb}[n] * \frac{h_{b\_opt}[n]}{g_{b\_opt}}$$

and the system is configured to generate the aligned input signal $x_p[n]$ according to:

$$x_p[n]=x[n].$$

9. The invention of claim 1, wherein the system is configured to adaptively update the adaptive pre-distorter in real time.

10. The invention of claim 1, wherein the system is configured to adaptively update the adaptive pre-distorter in non-real time.

11. The invention of claim 1, wherein the optimized filter is configured to align the input and feedback signals in other than gain and time.

12. The invention of claim 1, wherein the first linear distortion is linear magnitude distortion or linear phase distortion.

13. The invention of claim 12, wherein the multiple different types of linear distortions further include linear time distortion.

14. A method of linearizing a non-linear transmit path, the method comprising:
applying an input signal to an adaptive pre-distorter to generate a pre-distorted signal;
applying the pre-distorted signal to the non-linear transmit path to generate an output signal; and
generating a feedback signal based on the output signal using a feedback path, wherein the feedback signal has multiple different types of linear distortions including a first linear distortion that is not a linear time distortion; and
adapting the adaptive pre-distorter by:
(1) optimizing complex filter coefficients of a linear finite impulse response (FIR) filter to minimize a cost function based on the filter, the input signal, and the feedback signal;
(2) applying the optimized linear FIR filter to the input signal or the feedback signal to generate an aligned input signal and an aligned feedback signal, wherein the optimized linear FIR filter aligns the input and feedback signals with respect to all of the multiple different types of linear distortions in the feedback signal including the first linear distortion; and
(3) updating the adaptive pre-distorter based on the aligned input and feedback signals.

15. The invention of claim 14, wherein the non-linear transmit path comprises a non-linear power amplifier.

16. The invention of claim 14, wherein the cost function C(h) is given by:

$$C(h)=E\{(x[n]*h_a[n]-y_{fb}[n])^2\}$$

where:
x[n] is the input signal;
$y_{fb}[n]$ is the feedback signal;
$h_a[n]$ is the filter; and
E{.} is an expectation operator.

17. The invention of claim 16, wherein the complex gain $g_{a\_opt}$ of the optimized filter $h_{a\_opt}[n]$ is computed at zero frequency according to:

$$g_{a\_opt} = \sum_{k=0}^{N_h-1} h_{a\_opt}[k]$$

where:
$N_h$ is the length of the optimized filter.

18. The invention of claim 17, wherein:
the aligned input signal $x_p[n]$ is generated according to:

$$x_p[n] = x[n] * \frac{h_{a\_opt}[n]}{g_{a\_opt}}$$

and the aligned feedback signal $y_{fb\_p}[n]$ is generated according to:

$$y_{fb\_p}[n]=y_{fb}[n].$$

19. The invention of claim 14, wherein the cost function C(h) is given by:

$$C(h)=E\{(y_{fb}[n]*h_b[n]-x[n])^2\}$$

where:
x[n] is the input signal;
$y_{fb}[n]$ is the feedback signal;
$h_b[n]$ is the filter;
* denotes convolution; and
E{.} is an expectation operator.

20. The invention of claim 19, wherein the complex gain $g_{b\_opt}$ of the optimized filter $h_{b\_opt}[n]$ is computed at zero frequency according to:

$$g_{b\_opt} = \sum_{k=0}^{N_h-1} h_{b\_opt}[k]$$

where:
$N_h$ is the length of the optimized filter.

21. The invention of claim 20, wherein:
the aligned feedback signal $y_{fb\_p}[n]$ is generated according to:

$$y_{fb\_p}[n] = y_{fb}[n] * \frac{h_{b\_opt}[n]}{g_{b\_opt}}$$

and the aligned input signal $x_p[n]$ is generated according to:

$$x_p[n]=x[n].$$

22. The invention of claim 14, wherein the adaptive pre-distorter is adaptively updated in real time.

23. The invention of claim 14, wherein the adaptive pre-distorter is adaptively updated in non-real time.

24. The invention of claim 14, wherein the optimized filter is configured to align the input and feedback signals in other than gain and time.

25. The invention of claim 14, wherein the first linear distortion is linear magnitude distortion or linear phase distortion.

26. The invention of claim 25, wherein the multiple different types of linear distortions further include linear time distortion.

27. A linearized system comprising:
an adaptive pre-distorter configured to pre-distort an input signal to generate a pre-distorted signal;
a non-linear transmit path configured to generate an output signal from the pre-distorted signal; and
a feedback path configured to generate a feedback signal based on the output signal, wherein the system is configured to adapt the adaptive pre-distorter by:
(1) optimizing a filter that minimizes a cost function based on the input signal and the feedback signal, wherein the cost function C(h) is given by:

$$C(h)=E\{(x[n]*h_a[n]-y_{fb}[n])^2\}$$

where:
$x[n]$ is the input signal;
$y_{fb}[n]$ is the feedback signal;
$h_a[n]$ is the filter;
* denotes convolution; and
$E\{.\}$ is an expectation operator;
(2) applying the optimized filter to the input signal or the feedback signal to generate an aligned input signal and an aligned feedback signal; and
(3) updating the adaptive pre-distorter based on the aligned input and feedback signals.

28. The invention of claim 27, wherein the system is configured to compute the complex gain $g_{a\_opt}$ of the optimized filter $h_{a\_opt}[n]$ at zero frequency according to:

$$g_{a\_opt} = \sum_{k=0}^{N_h-1} h_{a\_opt}[k]$$

where:
$N_h$ is the length of the optimized filter.

29. The invention of claim 28, wherein:
the system is configured to generate the aligned input signal $x_p[n]$ according to:

$$x_p[n] = x[n] * \frac{h_{a\_opt}[n]}{g_{a\_opt}}$$

and the system is configured to generate the aligned feedback signal $y_{fb\_p}[n]$ according to:

$$y_{fb\_p}[n]=y_{fb}[n].$$

30. A linearized system comprising:
an adaptive pre-distorter configured to pre-distort an input signal to generate a pre-distorted signal;
a non-linear transmit path configured to generate an output signal from the pre-distorted signal; and
a feedback path configured to generate a feedback signal based on the output signal, wherein the system is configured to adapt the adaptive pre-distorter by:
(1) optimizing a filter that minimizes a cost function based on the input signal and the feedback signal, wherein the cost function C(h) is given by:

$$C(h)=E\{(y_{fb}[n]*h_b[n]-x[n])^2\}$$

where:
$x[n]$ is the input signal;
$y_{fb}[n]$ is the feedback signal;
$h_b[n]$ is the filter;
* denotes convolution; and
$E\{.\}$ is an expectation operator;
(2) applying the optimized filter to the input signal or the feedback signal to generate an aligned input signal and an aligned feedback signal; and
(3) updating the adaptive pre-distorter based on the aligned input and feedback signals.

31. The invention of claim 30, wherein the system is configured to compute the complex gain $g_{b\_opt}$ of the optimized filter $h_{b\_opt}[n]$ at zero frequency according to:

$$g_{b\_opt} = \sum_{k=0}^{N_h-1} h_{b\_opt}[k]$$

where:
$N_h$ is the length of the optimized filter.

32. The invention of claim 31, wherein:
the system is configured to generate the aligned feedback signal $y_{fb\_p}[n]$ according to:

$$y_{fb\_p}[n] = y_{fb}[n] * \frac{h_{b\_opt}[n]}{g_{b\_opt}}$$

and the system is configured to generate the aligned input signal $x_p[n]$ according to:

$$x_p[n]=x[n].$$

33. A method of linearizing a non-linear transmit path, the method comprising:
applying an input signal to an adaptive pre-distorter to generate a pre-distorted signal;
applying the pre-distorted signal to the non-linear transmit path to generate an output signal; and
generating a feedback signal based on the output signal using a feedback path; and
adapting the adaptive pre-distorter by:
(1) optimizing a filter that minimizes a cost function based on the input signal and the feedback signal, wherein the cost function C(h) is given by:

$$C(h)=E\{(x[n]*h_a[n]-y_{fb}[n])^2\}$$

where:
$x[n]$ is the input signal;
$y_{fb}[n]$ is the feedback signal;
$h_a[n]$ is the filter; and
$E\{.\}$ is an expectation operator;

(2) applying the optimized filter to the input signal or the feedback signal to generate an aligned input signal and an aligned feedback signal; and (3) updating the adaptive pre-distorter based on the aligned input and feedback signals.

34. The invention of claim 33, wherein the complex gain $g_{a\_opt}$ of the optimized filter $h_{a\_opt}[n]$ is computed at zero frequency according to:

$$g_{a\_opt} = \sum_{k=0}^{N_h-1} h_{a\_opt}[k]$$

where:
$N_h$ is the length of the optimized filter.

35. The invention of claim 34, wherein:
the aligned input signal $x_p[n]$ is generated according to:

$$x_p[n] = x[n] * \frac{h_{a\_opt}[n]}{g_{a\_opt}}$$

and the aligned feedback signal $y_{fb\_p}[n]$ is generated according to:

$y_{fb\_p}[n] = y_{fb}[n]$.

36. A method of linearizing a non-linear transmit path, the method comprising:
applying an input signal to an adaptive pre-distorter to generate a pre-distorted signal;
applying the pre-distorted signal to the non-linear transmit path to generate an output signal; and
generating a feedback signal based on the output signal using a feedback path; and
adapting the adaptive pre-distorter by:
(1) optimizing a filter that minimizes a cost function based on the input signal and the feedback signal, wherein the cost function C(h) is given by:

$C(h) = E\{(y_{fb}[n]*h_b[n]-x[n])^2\}$ where:
$x[n]$ is the input signal;
$y_{fb}[n]$ is the feedback signal;
$h_b[n]$ is the filter;
* denotes convolution; and
$E\{.\}$ is an expectation operator;

(2) applying the optimized filter to the input signal or the feedback signal to generate an aligned input signal and an aligned feedback signal; and (3) updating the adaptive pre-distorter based on the aligned input and feedback signals.

37. The invention of claim 36, wherein the complex gain $g_{b\_opt}$ of the optimized filter $h_{b\_opt}[n]$ is computed at zero frequency according to:

$$g_{b\_opt} = \sum_{k=0}^{N_h-1} h_{b\_opt}[k]$$

where:
$N_h$ is the length of the optimized filter.

38. The invention of claim 37, wherein:
the aligned feedback signal $y_{fb\_p}[n]$ is generated according to:

$$y_{fb\_p}[n] = y_{fb}[n] * \frac{h_{b\_opt}[n]}{g_{b\_opt}}$$

and the aligned input signal $x_p[n]$ is generated according to:

$x_p[n] = x[n]$.

* * * * *